US009907160B2

(12) United States Patent
Lin

(10) Patent No.: US 9,907,160 B2
(45) Date of Patent: Feb. 27, 2018

(54) PRINTED CIRCUIT BOARD INCLUDING DIFFERENTIAL TRANSMISSION LINES THEREON AND HAVING A CONDUCTIVE STRUCTURE WHICH PROVIDES IMMUNITY TO COMMON-MODE NOISE

(71) Applicant: HON HAI PRECISION INDUSTRY CO., LTD., New Taipei (TW)

(72) Inventor: Chih-Hao Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 28 days.

(21) Appl. No.: 15/157,339

(22) Filed: May 17, 2016

(65) Prior Publication Data

US 2017/0318666 A1 Nov. 2, 2017

(30) Foreign Application Priority Data

Apr. 29, 2016 (CN) .......................... 2016 1 0276848

(51) Int. Cl.

| | |
|---|---|
| ***H05K 1/02*** | (2006.01) |
| ***H05K 1/14*** | (2006.01) |
| ***H05K 1/11*** | (2006.01) |
| ***H01P 3/02*** | (2006.01) |

(52) U.S. Cl.
CPC ........... *H05K 1/0245* (2013.01); *H01P 3/026* (2013.01); *H05K 1/0216* (2013.01); *H05K 1/115* (2013.01); *H05K 1/144* (2013.01); *H05K 2201/041* (2013.01); *H05K 2201/093* (2013.01)

(58) Field of Classification Search
CPC ....... H01P 3/04; H05K 1/0245; H05K 1/0216
USPC ........................................... 333/4, 5, 238, 12
See application file for complete search history.

(56) References Cited

U.S. PATENT DOCUMENTS 7,397,320 B1 * 7/2008 Bokhari .................. H01P 3/081 333/1

* cited by examiner

*Primary Examiner* — Benny Lee
(74) *Attorney, Agent, or Firm* — ScienBiziP, P.C.

(57) ABSTRACT

A design for printed circuit board with reduced susceptibility to common-mode noise includes a first substrate, a differential pair of signal lines with two differential transmission lines laid on the first substrate, a second substrate, a metal layer located between the first substrate and the second substrate, and a grounding layer The second substrate is located between the second substrate and the grounding layer, and a conductive structure is located in the second substrate and couples the metal layer to the grounding layer. A length of the metal layer is substantially equal to a length of each of the two differential transmission lines.

17 Claims, 3 Drawing Sheets

W S W 63 612 611 61 60 65 621 62 622 700 66 h1 h2 d

PRINTED CIRCUIT BOARD INCLUDING DIFFERENTIAL TRANSMISSION LINES THEREON AND HAVING A CONDUCTIVE STRUCTURE WHICH PROVIDES IMMUNITY TO COMMON-MODE NOISE

FIELD

The subject matter herein generally relates to a printed circuit board having a common-mode filtering circuit layout.

BACKGROUND

When differential signal transmission are used in high-speed digital systems, unwanted common-mode noises may accompany the differential signal. For a high-speed data link, a cable is necessary to transmit the differential signal between two different electronic apparatuses. When the common-mode noises are coupled to the cable, the cable behaves as an electromagnetic interference (EMI) antenna. Suppressing the common-mode noises upon transmission of the differential signal is necessary.

BRIEF DESCRIPTION OF THE DRAWINGS

Implementations of the present technology will now be described, by way of example only, with reference to the attached figures.

DETAILED DESCRIPTION

Figure 1:
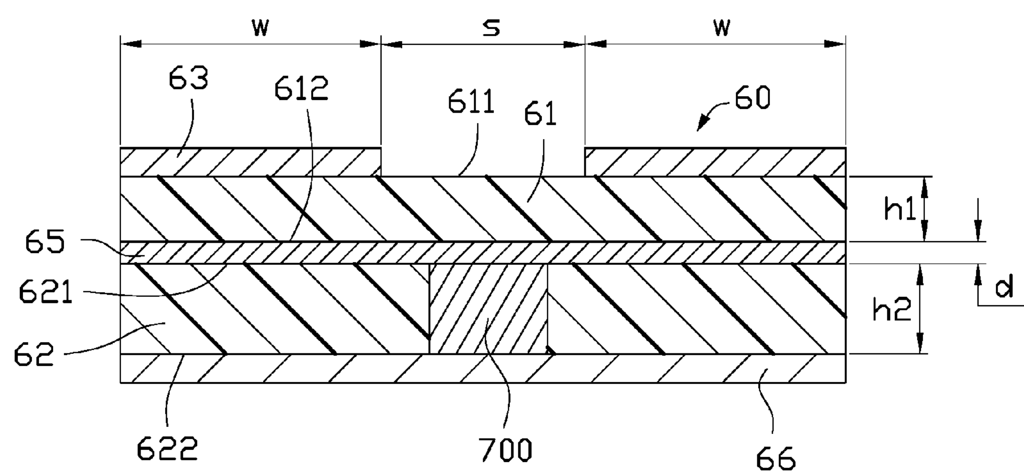
FIG. 1 is a schematic sectional view of an embodiment of a unit cell of a printed circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

DETAILED DESCRIPTION OF THE INVENTION

Figure 2:
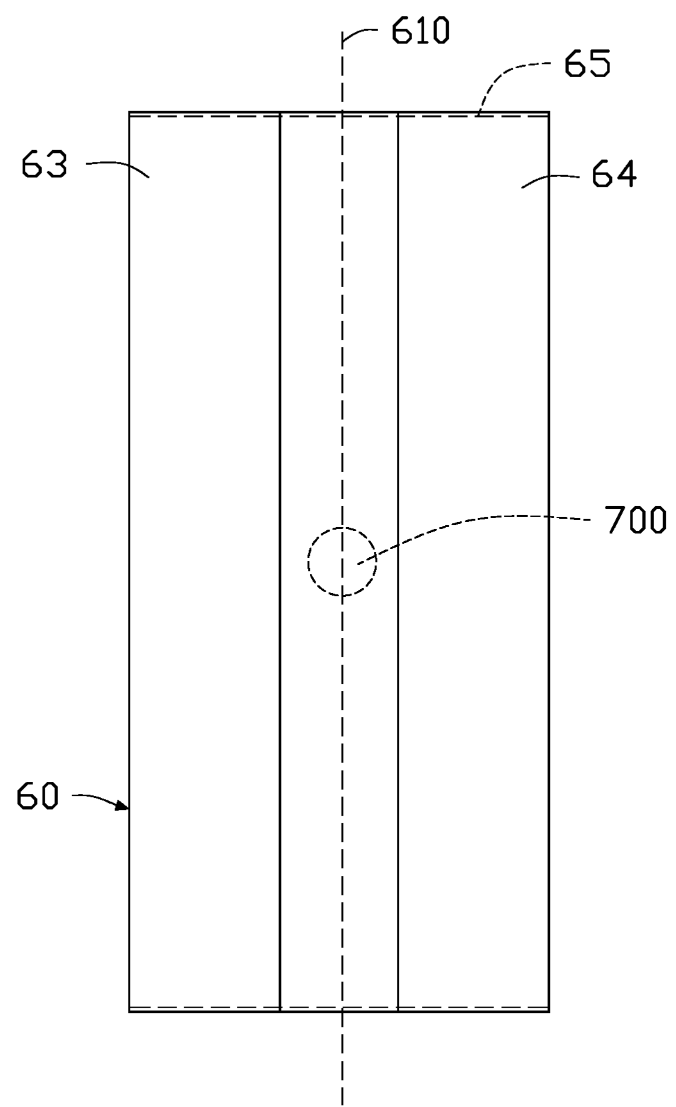
FIG. 2 is a schematic top view of the unit cell of the printed circuit board of FIG. 1.

FIG. 1 and FIG. 2 illustrate a printed circuit board 60 in an embodiment having a common-mode filtering circuit layout capable of suppressing common-mode noises upon transmission of a differential signal. The printed circuit board 60 of the present disclosure includes a differential pair of signal lines with two differential transmission lines 63, 64 (FIG. 2), a grounding layer 66 (FIG. 1), a first substrate 61 (FIG. 1), a second substrate 62 (FIG. 1), a metal layer 65, and a conductive structure 700.

As shown in FIG. 1, the first substrate 61 is an insulating substrate and has a first surface 611 and a second surface 612 opposite to the first surface 611. A thickness of the first substrate 61 is h1.

The second substrate 62 is an insulating substrate and has a third surface 621 and a fourth surface 622 opposite to the third surface 621. A thickness of the second substrate 62 is h2.

The two differential transmission lines 63, 64 are spaced apart from each other and symmetrical with respect to a centerline 610 (FIG. 2) defined there between and extending in a first direction. A width of each of the two differential transmission lines 63, 64 is w, and a distance between the two differential transmission lines 63, 64 is s.

The metal layer 65 is rectangular and located between the second surface 612 of the first substrate 61 and the third surface 621 of the second substrate 62. The metal layer 65 extends in the first direction with a length d substantially equal to a length of each of the two differential transmission lines 63, 64. A width of the metal layer 65 is equal to the widths of the two differential transmission lines 63, 64 (2*w*) plus the distance s between the two differential transmission lines 63, 64. The metal layer 65 is symmetrical with respect to the centerline 610.

In one embodiment, the conductive structure 700 is a via hole, which is configured to electronically couple the metal layer 65 to the grounding layer 66. The conductive structure 700 is located between the two differential transmission lines 63, 64 extending in a second direction, which is substantially perpendicular to the first direction. Preferably, the conductive structure 700 is aligned with and symmetrical with respect to the centerline 610.

Figure 3:
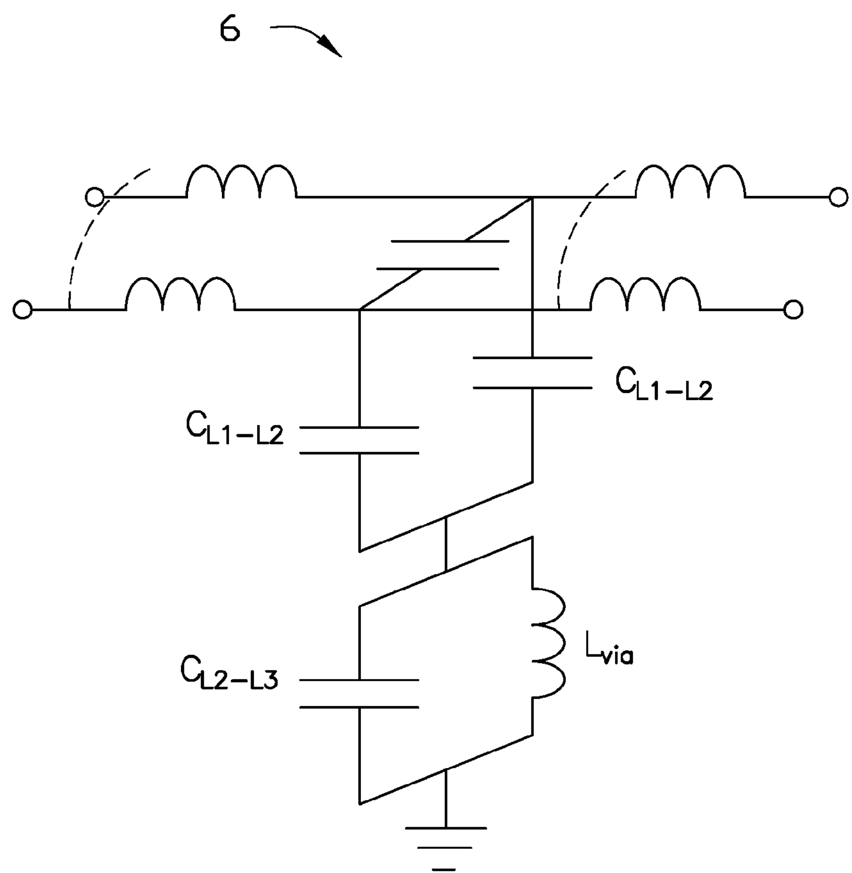
FIG. 3 is an equivalent lumped circuit of the unit cell of the circuit board of FIG. 1.

Referring to FIG. 3, the first substrate 61 (as depicted in FIG. 1), the second substrate 62 (as depicted in FIG. 1), the metal layer 65 (as depicted in FIG. 1), and the grounding layer 66 (as depicted in FIG. 1) constitute the common-mode filtering circuit 6. The common-mode filtering circuit 6 is a quarter wavelength resonator, which can reduce common-mode noise. The first substrate 61 and the second substrate 62 are equivalent to two capacitors $C_{L1-L2}$. The second substrate 62 and the grounding layer 66 are equivalent to a capacitor $C_{L2-L3}$ and an inductance $L_{via}$.

As depicted in FIG. 1, in at least one embodiment, the length of each of the two differential transmission lines 63, 64 is 300 mil, the width of each of the two differential transmission lines 63, 64 is 5 mil. The distance between the two differential transmission lines 63, 64 is 6.5 mil, the length of the metal layer 65 is 292 mil, the width of the metal layer 65 is 16.5 mil, and a distance between the centerline 610 and the grounding layer 66 is 24 mil. The common-mode filtering circuit 6 can suppress common-mode noise up to a clock speed of 8 GHz.

The embodiments shown and described above are only examples. Many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A printed circuit board comprising:

a first substrate;

a differential pair signal lines with two differential transmission lines laid on the first substrate;

a second substrate;

a metal layer located between the first substrate and the second substrate;

a grounding layer, and the second substrate is located between the metal layer and the grounding layer; and a conductive structure located in the second substrate and coupling the metal layer to the grounding layer;

wherein a length of the metal layer is substantially equal to a length of each of the two differential transmission lines; and a width of the metal layer is substantially equal to a width of each of the two differential transmission lines plus a distance between the two differential transmission lines.

2. The printed circuit board of claim 1, wherein each of the two differential transmission lines extends in a first direction, and the metal layer extends in the first direction.

3. The printed circuit board of claim 2, wherein the conductive structure extends in a second direction, which is substantially perpendicular to the first direction.

4. The printed circuit board of claim 1, wherein each of the first substrate and the second substrate is an insulating substrate.

5. The printed circuit board of claim 1, wherein the first substrate has a first surface and a second surface opposite to the first surface, and the second substrate has third surface and a fourth surface opposite to the third surface; the metal layer is sandwiched between the second surface and the third surface, and the grounding layer is attached to the fourth surface.

6. The printed circuit board of claim 5, wherein the metal layer is rectangular in shape and symmetrical with respect to a centerline defined between the two differential transmission lines.

7. The printed circuit board of claim 6, wherein the conductive structure is a via hole.

8. The printed circuit board of claim 7, wherein the via hole is located between the two differential transmission lines.

9. The printed circuit board of claim 8, wherein the via hole is symmetrical with respect to the centerline.

10. A printed circuit board comprising:

a first substrate;

a differential pair signal lines with two differential transmission lines laid on the first substrate;

a second substrate;

a metal layer located between the first substrate and the second substrate;

a grounding layer, and the second substrate is located between the metal layer and the grounding layer; and a conductive structure located in the second substrate and coupling the metal layer to the grounding layer;

wherein each of the two differential transmission lines extends in a first direction, and the metal layer extends in the first direction and is symmetrical with respect to a centerline defined between the two differential transmission lines;

a length of the metal layer is substantially equal to a length of each of the two differential transmission lines; and a width of the metal layer is substantially equal to a width of each of the two differential transmission lines plus a distance between the two differential transmission lines.

11. The printed circuit board of claim 10, wherein the conductive structure extends in a second direction, which is substantially perpendicular to the first direction.

12. The printed circuit board of claim 10, wherein each of the first substrate and the second substrate is an insulating substrate.

13. The printed circuit board of claim 10, wherein the first substrate has a first surface and a second surface opposite to the first surface, and the second substrate has third surface and a fourth surface opposite to the third surface; the metal layer is sandwiched between the second surface and the third surface, and the grounding layer is attached to the fourth surface.

14. The printed circuit board of claim 13, wherein the metal layer is rectangular in shape.

15. The printed circuit board of claim 14, wherein the conductive structure is a via hole.

16. The printed circuit board of claim 15, wherein the via hole is located between the two differential transmission lines.

17. The printed circuit board of claim 16, wherein the via hole is symmetrical with respect to the centerline.

* * * * *